United States Patent
Takao

(10) Patent No.: US 7,377,815 B2
(45) Date of Patent: May 27, 2008

(54) CARD CONNECTOR DEVICE

(75) Inventor: Kazuaki Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/320,532

(22) Filed: Dec. 29, 2005

(65) Prior Publication Data
US 2007/0082520 A1  Apr. 12, 2007

(30) Foreign Application Priority Data
Sep. 27, 2005  (JP) .............................. 2005-279998

(51) Int. Cl.
*H01R 24/00*  (2006.01)
(52) U.S. Cl. ..................... 439/630; 439/633; 439/159; 439/892; 439/607; 361/737
(58) Field of Classification Search ................ 439/630, 439/633, 377, 64, 892, 159, 607, 357; 361/737
See application file for complete search history.

(56) References Cited

U.S. PATENT DOCUMENTS

| | | | | |
|---|---|---|---|---|
| 6,568,960 B2 * | 5/2003 | Bricaud et al. | ............. | 439/630 |
| 6,641,413 B2 * | 11/2003 | Kuroda | ........................ | 439/159 |
| 6,648,694 B2 * | 11/2003 | Takamori et al. | ........... | 439/630 |
| 6,655,973 B2 * | 12/2003 | Ji et al. | ........................ | 439/159 |
| 6,716,066 B1 * | 4/2004 | Kuo | ........................... | 439/630 |
| 6,780,062 B2 * | 8/2004 | Liu et al. | .................... | 439/630 |
| 6,814,596 B2 * | 11/2004 | Yu et al. | ..................... | 439/159 |
| 6,857,907 B1 * | 2/2005 | Hung et al. | .................. | 439/630 |
| 6,863,571 B2 * | 3/2005 | Sato et al. | ................... | 439/630 |
| 6,932,652 B1 * | 8/2005 | Chen | ........................... | 439/630 |
| 6,988,904 B1 * | 1/2006 | Lai | ............................. | 439/159 |
| 7,029,299 B1 * | 4/2006 | Chen | ........................... | 439/159 |
| 2002/0102882 A1 * | 8/2002 | Tanaka | ....................... | 439/630 |
| 2003/0064627 A1 * | 4/2003 | Ooya et al. | ................. | 439/630 |
| 2005/0277333 A1 * | 12/2005 | Kuo | ........................... | 439/607 |
| 2005/0287870 A1 * | 12/2005 | Kuo | ........................... | 439/630 |

FOREIGN PATENT DOCUMENTS

| | | |
|---|---|---|
| EP | 0895178 A2 | 2/1999 |
| JP | 3-251976 | 11/1991 |
| JP | 2004-63197 | 2/2004 |
| JP | 2004-71257 | 3/2004 |
| TW | M274690 | 9/2005 |

OTHER PUBLICATIONS

Notice of Allowance for corresponding Taiwanese application dated Aug. 9, 2007 with English translation.

* cited by examiner

*Primary Examiner*—T. C. Patel
*Assistant Examiner*—Harshad C Patel
(74) *Attorney, Agent, or Firm*—Kratz, Quintos & Hanson, LLP

(57) ABSTRACT

A card connector device whose structure is simple and which can hold plural types of cards of different widths. A plate-spring-shaped card position control unit is formed on the top of a case by partially cutting off a part of the case. The tip of the card position control unit is folded and protrudes from the case by a prescribed distance toward the bottom of the case.

5 Claims, 6 Drawing Sheets

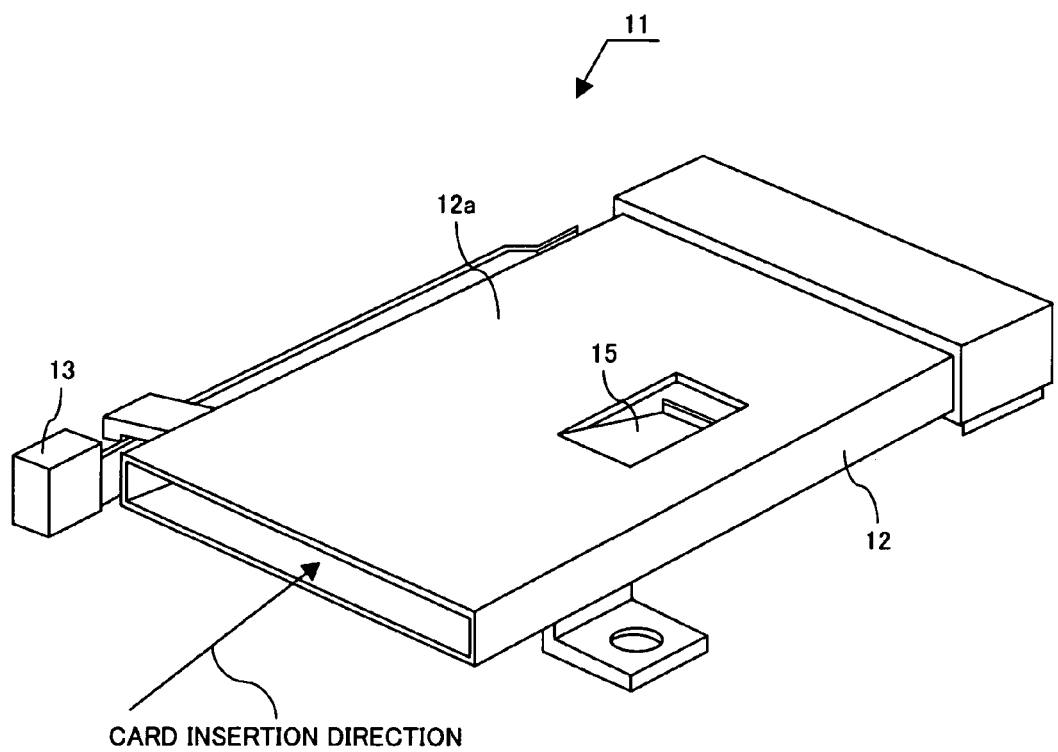
F I G. 1

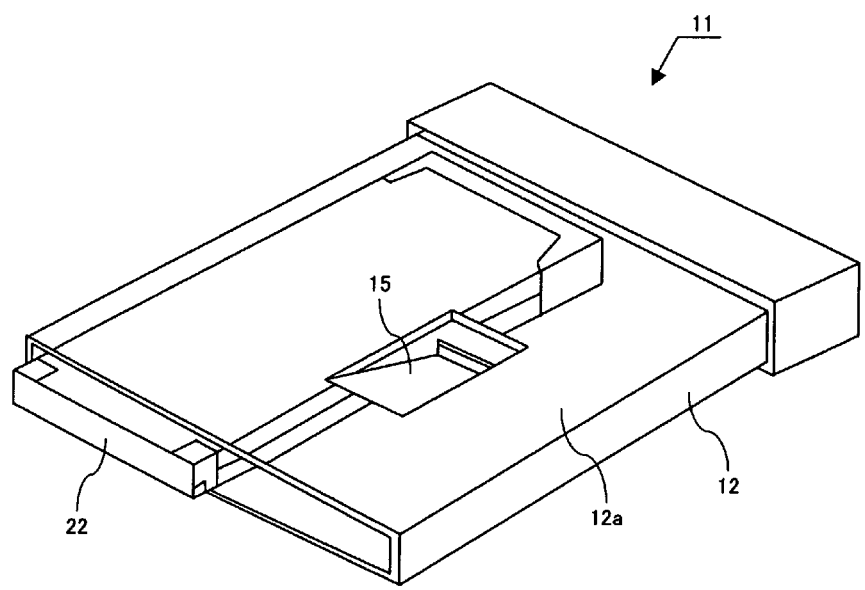
FIG. 3A
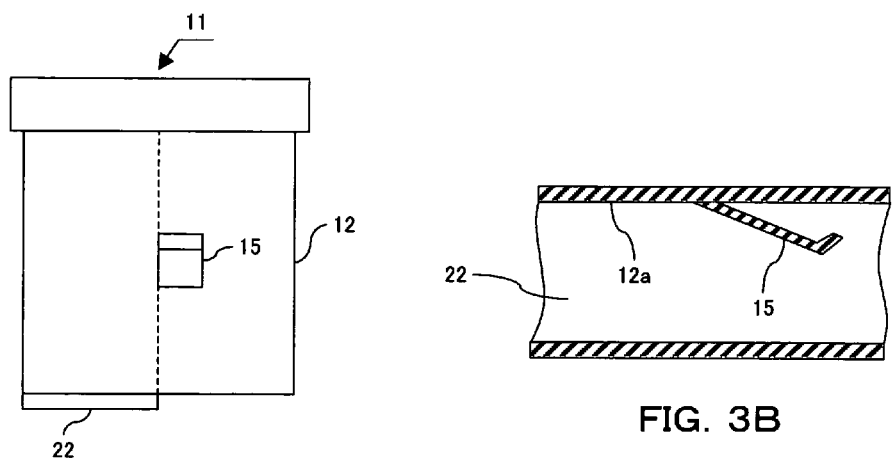
FIG. 3B
FIG. 3C

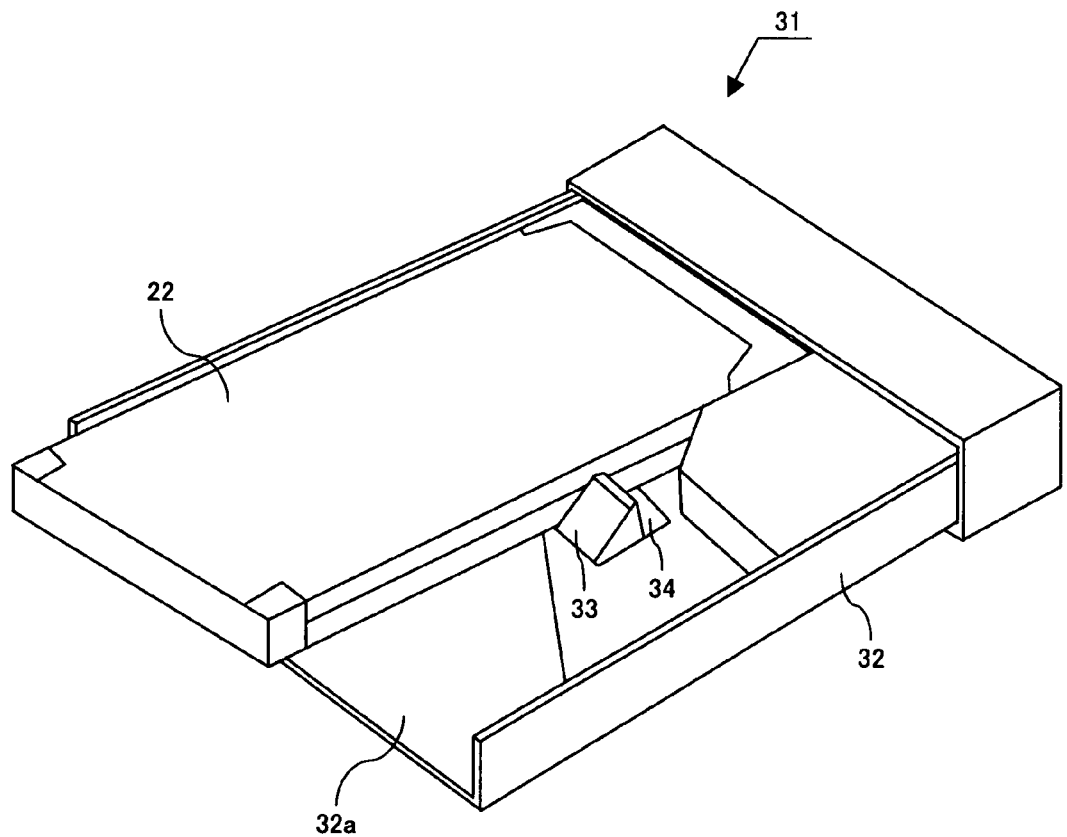
F I G. 4

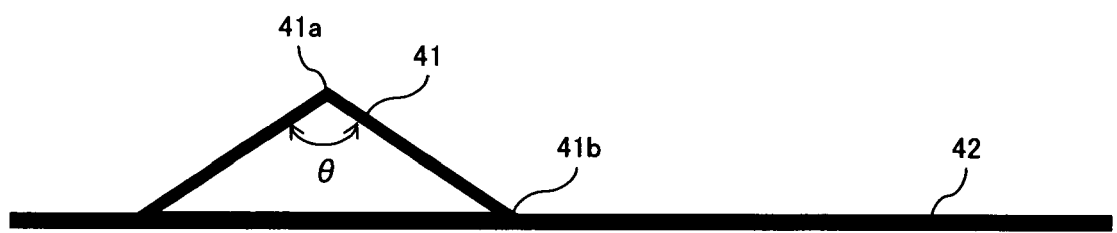
F I G. 6

CARD CONNECTOR DEVICE

BACKGROUND OF THE INVENTION

1. Field of the Invention

The present invention relates to a card connector device used in a personal computer or the like.

2. Description of the Related Art

PCI cards, such as a memory card used in a personal computer, a LAN card and the like are known. Because PCI cards have a variety of widths, in order to insert such PCI cards in one slot, the positional relationship between an electrode on the card side and am electrode on the card connector side must be constant against such cards of a variety of sizes.

Patent reference 1 discloses a plate spring which can be moved to absorb the width differences of the cards and which is provided on each side of the case so that two types of PCI cards with different sizes can be inserted in the same slot.

Patent reference 2 discloses a structure which is provided with a card guiding member which can be pulled out and back in such a way as to narrow the width of a card insertion slot and a card of a different size is guided to a card mounting unit by adjusting the side position by the card guiding member.

Against a PCI card for transferring data in parallel, using a PCI bus, an EXPRESS card for transferring data serially is also known. The EXPRESS card also has a plurality of widths.

The EXPRESS card has two standard widths of 54 mm and 34 mm. The slot size of an EXPRESS-card connector device is designed to be wide so that EXPRESS cards of different sizes can be inserted in the same slot. When a narrow card is inserted, a space of approximately 20 mm occurs in the card connector part corresponding to the side of the inserted EXPRESS card and the side of the EXPRESS card cannot be supported. Therefore, when a side force is repeatedly applied to the tip (part protruding from the slot) of the EXPRESS card, the card moves in the card connector and it finally comes out of the connector.

In order to solve such a problem, Patent references 1 and 2 can be adopted, However, in either case, the structure of a card connector device becomes complex.

Patent reference 1: Japanese Patent Application No. 2004-63197

Patent reference 2: Japanese Patent Application No. 2004-71257

SUMMARY OF THE INVENTION

It is an object of the present invention to provide a card connector device whose structure is simple and which can properly hold cards of a variety of widths.

The present invention is a card connector device in which cards of a plurality of widths can be inserted. The card connector device comprises a case in which a card is inserted, a connector which is provided in the case and is connected with the card and a card position control unit which is formed on the top or bottom of the case and which is pushed by the card when a card of a first size is inserted and supports the side of the card when a card of a second size narrower than the first size is inserted.

According to the present invention, when a narrow card is inserted, the card position control unit protrudes from the bottom or top of the case. Therefore, the card side is supported by the cars position control unit and the side movement of the card is restricted. Thus, when a side force is repeatedly applied to the tip of the card, the card is prevented from coming out of the connector.

In the card connector device of the present invention, the card position control unit is a plate spring formed by partially cutting off a part of the base or top of the case.

By adopting such a structure, because the card position control unit can be incorporated in the case, the positions of cards of different widths can be easily controlled.

In the card connector device of the present invention, the card position control unit is mounted on the base or top of the case in such a way as to be rotated using one end as a fulcrum and is pushed toward the top or bottom of the case.

In such a structure, the strength of pushing force toward the top or bottom of the case can be easily set arbitrarily by changing the strength of the spring.

In the card connector device of the present invention, the section of the card position control unit which can be obtained by partially cutting off a part of the base or top of the case is almost triangle. When a card of a width greater than a distance between the guide on the side of the case and the card position control unit is inserted, the top of the card position control unit is pushed by the inserted card and the top of the card position control unit is pulled down or up to the height of the bottom or top.

In such a structure, by changing the sectional shape of the card position control unit, force needed to push the card position control unit can be arbitrarily set.

BRIEF DESCRIPTION OF THE DRAWINGS

FIG. 1 is the perspective appearance view of the card connector device of the first preferred embodiment.

FIGS. 3A, 3B and 3C show the accommodation state in the case where a card of a narrow width is inserted.

FIG. 4 is the perspective appearance view of the card connector device of the second preferred embodiment.

FIG. 6 shows the structure of the card position control unit of the third preferred embodiment.

DESCRIPTION OF THE PREFERRED EMBODIMENTS

Figure 2A:
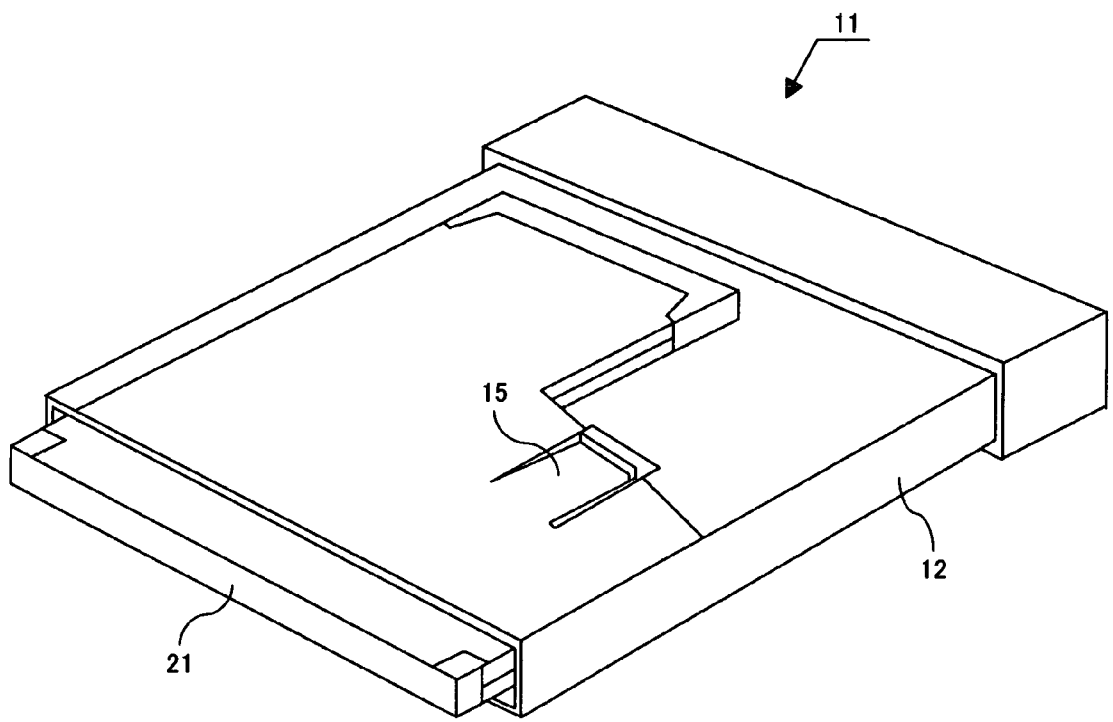
FIGS. 2A and 2B show the accommodation state in the case where a card of a wide width is inserted.

The preferred embodiments of the present invention are described below with reference to the drawings. FIG. 1 is the perspective appearance view of the card connector device 11 of the first preferred embodiment. This card connector device 11 is used for the EXPRESS card of a personal computer. Although the preferred embodiments are described below targeting the EXPRESS card, the present invention is applicable to all connectors to which cards of different widths are connected.

The card connector device 11 comprises a metal case 12, a slot 14 in which an EXPRESS card is inserted and an injection button 13 which is operated when discharging outside the EXPRESS card inserted in the case. A connector unit with an EXPRESS-card serial transfer interface is provided inside the case 12. The card inserted in the card connector device 11 is connected to the connector unit.

A part of the top 12a of the case 12 is partially cut off, a plate-spring-shaped card position control unit 15 is formed, the end of the cut-off part is folded and the tip protrudes toward the bottom (the bottom of the case 12, opposing to the top 12*a*) by a prescribed distance. Because this card position control unit 15 rebounds like a plate spring, it can be pulled out and back in the direction perpendicular to the top 12*a* of the case 12.

The respective operations of the card position control unit 15 in the case where an EXPRESS card having a large width (hereinafter the insertion direction and a direction orthogonal to it, of a card are called vertical and width directions, respectively) and where a card of a narrow width is inserted are described below.

Figure 2B:
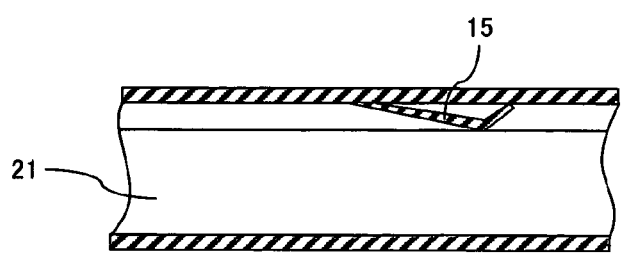

FIG. 2A show the accommodation state in the case where a card 21 of a large width (approximately 54 mm) is inserted. FIG. 2B is the typical section view of the case in the vicinity of the card position control unit 15. FIG. 2A also shows the perspective of the EXPRESS card inside the case.

As shown in FIG. 2A, when a card 21 of a large width is inserted, the card position control unit 15 protruding vertically downward (toward the bottom of the case 12) touches the top of the EXPRESS card 21 and the tip of the card position control unit 15 is pushed vertically upward. As a result, the card position control unit 15 is pushed up by the card 21 of a large width, is moved vertically upward, is compressed and touches the EXPRESS card 21, as shown in FIG. 2B.

Therefore, when using a card 21 of a large width, the EXPRESS card 21 can be freely inserted without being disturbed by the card position control unit 15. In this case, the side position of the EXPRESS card 21 is restricted by the guides on each side of the case 12.

FIG. 3A shows the accommodation state in the case where a card of a narrow width (approximately 34 mm) is inserted. FIG. 3B is the typical section view of the case in the vicinity of the card position control unit 15. FIG. 3C is the top view of the card connector device 11.

As shown in FIG. 3A, when an EXPRESS card 22 of a narrow width is inserted, the top of the EXPRESS card 22 does not touch the card position control unit 15 because the width of the EXPRESS card 22 is narrow. As a result, as shown in FIG. 3B, the card position control unit 15 keeps protruding by the prescribed distance from the top 12*a* of the case 12. In this case, as shown in FIGS. 3A and 3C, the one side of the EXPRESS card 22 is supported by the side of the case 12, the other side of the EXPRESS card 22 is supported by the card position control unit 15. Thus, the side position of the EXPRESS card 22 is restricted by the card position control unit 15.

Therefore, even when an EXPRESS card 22 of a narrow width is inserted in the card connector device 11 and force is repeatedly applied to the tip of the EXPRESS card 22 from the side, the EXPRESS card 22 is prevented from coming out of the connector unit because the side position of the EXPRESS card 22 is restricted by the card position control unit 15. More particularly, when the tip of a card is shaped to protrude outside from the case 12, side force is easily applied to a card. However, by adopting the card position control unit 15 of this preferred embodiment, even such a card can be prevented from coming out of the connector unit.

According to the above-described first preferred embodiment if a side force is repeatedly applied to the tip of the EXPRESS card 22 when the EXPRESS card 22 of the narrow width is inserted, the EXPRESS card 22 can be prevented from coming out of the card connector device 11 because the side movement of the EXPRESS card 22 is restricted by the card position control unit 15. In this case, because the card position control unit 15 is formed by partially cutting off a part of the case 12 and folding the cut-off end, the card position control unit 15 can be simplified.

Furthermore, making the case 12 and the card position control unit 15 of a steel plate and making the card position control unit 15 touch the EXPRESS card, the case of the EXPRESS card can be grounded. Thus, the EXPRESS card can be shielded.

Figure 5A:
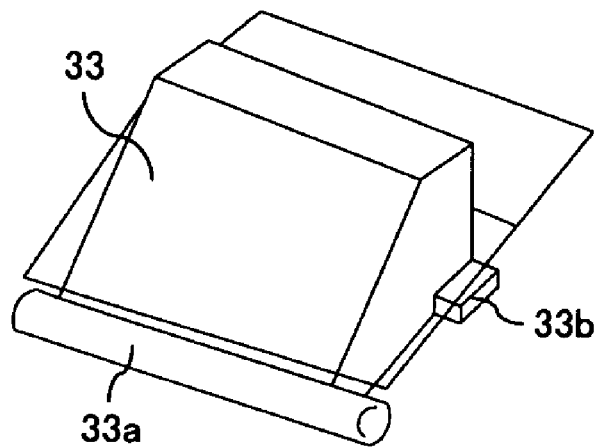
FIGS. 5A and 5B show the structure of the card position control unit.
Figure 5B:
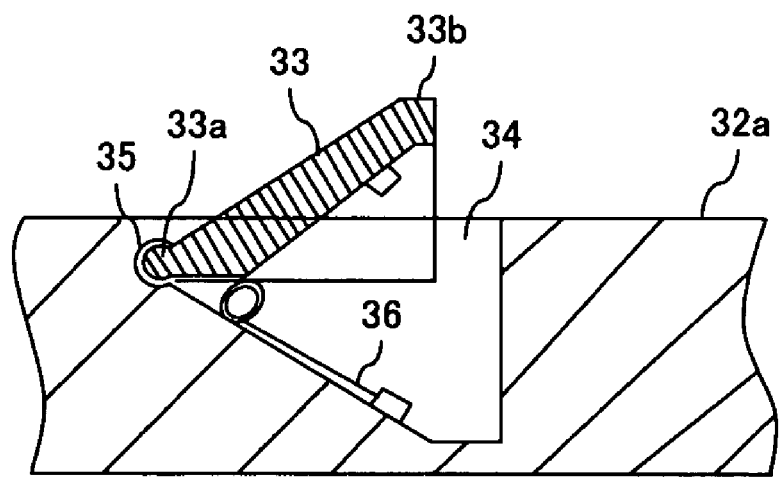

FIG. 4 is a perspective appearance view of the card connector device 31 of the second preferred embodiment. FIG. 5 shows the structure of the card position control unit 34 of the second preferred embodiment. FIG. 5A is the perspective appearance view of the card position control unit 33. FIG. 5B is its typical section view. In this second preferred embodiment, the card position control unit 33 and a case 32 are separate components.

As shown in FIGS. 4 and 5, a groove 34 for mounting the card position control unit 33 so in such a way as to be rotated is formed on the bottom 32*a* of the case 32. The groove 34 is a large concave part or a through hole which can accommodate the card position control unit 33 inside the bottom 32*a* of the case 32 when the card position control unit 33 is pushed vertically downward.

As shown FIG. 5B, a hole 35 in which the tip 33*a* of the card control unit 33 is inserted is provided in the upper part of the groove 34. A coil spring 36 is inserted between the bottom of the card position control unit 33 and the bottom of the groove 34. The card position control unit 33 is pushed vertically upward by this coil spring and its tip 33*a* is inserted in the hole 35 of the bottom 32*a* of the case 32 in such a way as to be rotated.

Therefore, in an ordinary state (state where the card position control unit 33 is not pushed out by an EXPRESS card), the card position control unit 33 id lifted vertically upward by the coil spring 36 and the tip 33*b* of the card position control unit 33 protrudes from the bottom 32*a* of the case 32.

In FIG. 4, when an EXPRESS card 21 (see FIG. 2) of a width larger than the distance between the left side (or the guide on the left side) of the case 32 and the card position control unit 33 is inserted, the card position control unit 33 is pushed downward by the bottom of the EXPRESS card 21 and the card position control unit 33 is pulled back to the height of the bottom 32*a*.

On the other hand, when an EXPRESS card 22 of a width narrower than the distance between the left side (or the guide on the left side) of the case 32 and the card position control unit 33 is inserted, the card position control unit 33 keeps protruding from the bottom 32*a* by the prescribed distance since the card position control unit 33 in not pushed by the EXPRESS card 22.

Therefore, the side movement of the EXPRESS card 22 of a narrow width is restricted by the card position control unit 33. For example, even if the LAN card is pulled and side force is repeatedly applied to the tip of the EXPRESS card 22 when the EXPRESS card 22 shown in FIG. 4 is a LAN cable and the LAN cable is connected and used, the EXPRESS card 22 can be prevented from coming out of the card connection device 31 since the side movement of the EXPRESS card 22 is restricted by the card position control unit 33.

According to the card connector device 31 of the above-described second preferred embodiment, if a side force is repeatedly applied to the tip of the EXPRESS card 22 when the EXPRESS card 22 of a narrow width is inserted, the EXPRESS card 22 can be prevented from coming out of the card connection device 31 because the side movement of the EXPRESS card 22 is restricted by the card position control unit 33. Because the card position control unit 33 is mounted on the case 32, using the coil spring 36, the card position control unit 33 can be simplified and an arbitrary material, such as a plastic or the like, can be used for the card position control unit 33. Furthermore, by changing the strength of the coil spring, force for pushing the card position control unit 33 vertically upward can be arbitrarily set and force needed to insert an EXPRESS card 21 of a wide width (force for pushing the card position control unit 33) can be arbitrarily designed.

FIG. 6 shows the structure of the card position control unit 41 of the third preferred embodiment. The structure of the card connector device is the same as that of the first preferred embodiment. FIG. 6 is the section view of the case 12 in the vicinity of the card position control unit 41. The card position control unit 41 has the shape of a triangular prism having a prescribed length in the depth direction of the paper of FIG. 6.

The card position control unit 41 of the third preferred embodiment is obtained by partially cutting off a part of the bottom 42 of the case, forming a plate spring, folding the almost the center of the plate spring at a prescribe angle and forming a triangular prism whose section is triangular.

The card position control unit 41 having a triangular section is provided at a position away from the side of the case by a prescribed distance, as in FIG. 1.

When the EXPRESS card 21 of a width larger than the distance between the side of the case and the card position control unit 41 is inserted, the triangular peak 41a of the card position control unit 41 is pushed down by the EXPRESS card 21 and the card position control unit 41 is transformed in such a way the angle between two sides widen. When the EXPRESS card 21 is further inserted in the card connector device to be connected to the connector unit, the peak 41a of the card position control unit 41 is pushed down up to the height of the bottom 42.

When the EXPRESS card 22 of a width narrower than the distance between the side of the case and the card position control unit 41 is inserted, the card position control unit 41 keeps protruding from the bottom 42 by a prescribed distance.

Thus, the side position of the EXPRESS card 22 of a narrow width is restricted by the card position control unit 41. For example, even if the LAN cable is pulled and side force is repeatedly applied to the tip of the EXPRESS card 22 when the EXPRESS card 22 is a LAN card and a LAN cable is connected to the LAN card, the EXPRESS card 22 can be prevented from coming out of the card connector device since the side position of the EXPRESS card is restricted by the card position control unit 41.

According to the card connector device of the above-described third preferred embodiment, even when an EXPRESS card 22 of a narrow width is inserted, the side movement of the EXPRESS card 22 is restricted. Therefore, even when a side force is repeatedly applied to the EXPRESS card 22, the EXPRESS card 22 can be prevented from coming out of the card connector device. Because the section of the card position control unit 41 is triangular, its structure can be simplified.

The present invention is not limited to the above-described preferred embodiments and it can also configure as follows.

The number of the card position control unit 15 to be incorporated into the case is not limited to one, and a plurality of card position control units 15 can also adjust the card pushing force.

According to the present invention, a simply-structured card connector device in which each of plural types of cards of different widths can be held at its proper position and a card can be prevented from coming out of the connector can be realized.

What is claimed is:

1. A card connector device in which a plurality of types of cards of different widths can be inserted, comprising:
   a case in which a card is inserted;
   a connector which is provided in the case and is connected with the card; and
   a card position control unit which is formed on the top or bottom of the case and which is pushed by the card when a card of a first size is inserted and is arranged at a predetermined distance from a side of the case so as to only laterally support the side of the card when a card of a second size narrower than the first size is inserted.

2. The card connector device according to claim 1, wherein the card position control unit is obtained by partially cutting off a part of the bottom or top of the case and forming a plate spring.

3. The card connector device according to claim 1, wherein the card position control unit is mounted on the bottom or top of the case so as to be rotated using its one end as a fulcrum and is pushed toward the top or bottom of the case by a spring.

4. The card connector device according to claim 1, wherein the card position control unit is obtained by partially cutting off a part of the bottom or top of the case and its section is triangular, and when a card of a width larger than a distance between a guide on the case side and the card position control unit is inserted, a peak of the card position control unit is pushed to a height of the bottom or top of the case by the card.

5. The card connector device according to claim 1, wherein the card position control unit is a plate spring formed by partially cutting off a part of the case and protrudes from the case by a prescribed distance toward the top or bottom of the case.

* * * * *